United States Patent
Swank

(10) Patent No.: US 7,885,774 B2
(45) Date of Patent: Feb. 8, 2011

(54) SYSTEM AND METHOD FOR ANALYZING POWER FLOW IN SEMICONDUCTOR PLASMA GENERATION SYSTEMS

(75) Inventor: John D. Swank, Hudson, OH (US)

(73) Assignee: Bird Technologies Group Inc., Solon, OH (US)

( * ) Notice: Subject to any disclaimer, the term of this patent is extended or adjusted under 35 U.S.C. 154(b) by 518 days.

(21) Appl. No.: 11/921,688

(22) PCT Filed: May 10, 2006

(86) PCT No.: PCT/US2006/018087

§ 371 (c)(1),
(2), (4) Date: Dec. 6, 2007

(87) PCT Pub. No.: WO2006/135515

PCT Pub. Date: Dec. 21, 2006

(65) Prior Publication Data

US 2009/0210181 A1    Aug. 20, 2009

Related U.S. Application Data

(60) Provisional application No. 60/689,769, filed on Jun. 10, 2005.

(51) Int. Cl.
  *G01R 33/422* (2006.01)
(52) U.S. Cl. .............................. 702/66; 702/72; 702/75; 702/76
(58) Field of Classification Search ............. 702/65, 702/66, 76, 82, 127, 181, 184, 187, 188; 216/59; 315/111.21; 324/76.21; 455/69; 700/121
See application file for complete search history.

(56) References Cited

U.S. PATENT DOCUMENTS

| | | | |
|---|---|---|---|
| 4,263,653 | A | 4/1981 | Mecklenburg |
| 4,360,788 | A | 11/1982 | Erps et al. |
| 4,547,728 | A | 10/1985 | Mecklenburg |
| 4,584,079 | A | 4/1986 | Lee et al. |
| 5,273,610 | A | 12/1993 | Thomas, III et al. |
| 5,414,324 | A | 5/1995 | Roth et al. |
| 5,467,013 | A | 11/1995 | Williams et al. |
| 5,472,561 | A | 12/1995 | Williams et al. |
| 5,523,955 | A | 6/1996 | Heckman |

(Continued)

FOREIGN PATENT DOCUMENTS

EP    0 793 108 A2    9/1997

*Primary Examiner*—Eliseo Ramos Feliciano
*Assistant Examiner*—Felix E Suarez
(74) *Attorney, Agent, or Firm*—Wegman, Hessler & Vanderburg

(57) ABSTRACT

A system and method for measuring and analyzing power flow parameters in RF-based excitation systems for semiconductor plasma generators. A measuring probe (8) is connected to an RF transmission line for receiving and measuring voltage (10) and current signals (12) from the transmission line (4). A high-speed sampling process converts the measured RF voltage and current signals into digital signals. The digital signals are then processed so as to reveal fundamental and harmonic amplitude and phase information corresponding to the original RF signals. Multiple measuring probes may be inserted in the power transmission path to measure two-port parameters, and the networked probes may be interrogated to determine input impedance, output impedance, insertion loss, internal dissipation, power flow efficiency, scattering, and the effect of plasma non-linearity on the RF signal.

20 Claims, 6 Drawing Sheets

U.S. PATENT DOCUMENTS

| | | | |
|---|---|---|---|
| 5,587,917 A | 12/1996 | Elms | |
| 5,754,440 A | 5/1998 | Cox et al. | |
| 5,900,105 A | 5/1999 | Toshima | |
| 6,095,083 A | 8/2000 | Rice et al. | |
| 6,098,568 A | 8/2000 | Raoux et al. | |
| 6,155,199 A | 12/2000 | Chen et al. | |
| 6,252,354 B1 | 6/2001 | Collins et al. | |
| 6,265,831 B1 * | 7/2001 | Howald et al. | 315/111.21 |
| 6,269,135 B1 | 7/2001 | Sander | |
| 6,351,683 B1 * | 2/2002 | Johnson et al. | 700/121 |
| 6,469,488 B1 * | 10/2002 | Hopkins et al. | 324/76.21 |
| 6,623,596 B1 | 9/2003 | Collins et al. | |
| 6,652,717 B1 | 11/2003 | Hong | |
| 6,676,802 B2 | 1/2004 | Roth | |
| 6,677,711 B2 | 1/2004 | MacGearailt | |
| 6,920,312 B1 * | 7/2005 | Benjamin | 455/69 |
| 6,962,664 B2 * | 11/2005 | Mitrovic | 216/59 |
| 7,345,428 B2 | 3/2008 | Turner | |
| 2001/0047760 A1 | 12/2001 | Moslehi | |
| 2002/0108933 A1 | 8/2002 | Hoffman et al. | |
| 2003/0198753 A1 | 10/2003 | Tong et al. | |
| 2004/0116080 A1 | 6/2004 | Chen et al. | |

* cited by examiner

SYSTEM AND METHOD FOR ANALYZING POWER FLOW IN SEMICONDUCTOR PLASMA GENERATION SYSTEMS

CROSS-REFERENCE TO RELATED APPLICATION

This application claims the priority filing benefit of U.S. Provisional Application Ser. No. 60/689,769 filed Jun. 10, 2005.

FIELD OF THE INVENTION

The present invention relates generally to the measurement of power flow in RF transmission systems, and more particularly relates to systems and methods for measuring fundamental and harmonic amplitude and phase relationships of voltage and current signals in RF-based excitation systems for semiconductor plasma generators.

BACKGROUND OF THE INVENTION

RF plasma reactors of the type employed in processing semiconductor wafers require a large amount of RF power. Basically, the technique involves the ignition and maintenance of a processing plasma through the application of electric power to the plasma. The plasma interacts with gases introduced and with the target and wafer surfaces involved to affect the desired processing results.

Due to the increasing complexity of semiconductor devices, tighter and tighter control over the manufacturing process has been required. In order to achieve tighter process control in modern plasma processing, it is desirable to obtain more information about the associated RF voltage and current signals under actual processing conditions. This usually has been done by available V-I probes inserted in the power transmission path to measure the fundamental and harmonic signal power being directed to the plasma generation system.

Those skilled in the art have recognized that the fundamental and harmonic amplitude and phase angle relationships of the RF voltage and current signals account for much of the variation in process performance during semiconductor wafer manufacture. Due to non-linearity of the processing plasma, harmonics of the fundamental RF excitation frequency will be induced, even if the load appears to be matched at its fundamental frequency. As a result, the overall power delivered to the processing plasma includes the sum of the power levels of the fundamental and harmonic frequencies. Known plasma processing tools routinely employ two or more RF signal frequencies to enhance process performance yields. However, the introduction of two or more excitation frequencies into the plasma generation system tends to increase process uncertainty due to the introduction of intermodulation frequency components into the total power flow.

Prior art attempts have been made to characterize power flow in plasma processing, such as those disclosed in U.S. Pat. Nos. 5,523,955 and 5,273,610. For example, U.S. Pat. No. 5,523,955 discloses a measuring probe inserted in the power transmission path for sensing RF signals. The sensed signals are then used to indirectly derive AC signals for calculating phase angle information relating to the original sensed signals. However, until the present invention, the techniques required to directly measure the relative phase angle information of the fundamental and harmonic frequency content of the RF voltage and current signals in an accurate and stable fashion have not been readily available to those skilled in the art.

Therefore, there remains a strong need to provide a system and method for measuring and analyzing the critical amplitude and phase angle relationships between the fundamental signal frequencies and harmonics of the fundamental frequencies. Information characterizing the frequency content of the RF excitation signals can then be monitored to regulate and control power flow to the processing chamber in order to improve manufacturing yields, and make plasma processing more controlled and repeatable.

Although the present invention is described herein in terms of a system and method for analyzing power flow in semiconductor plasma generators, those skilled in the art will appreciate that the present invention may also be used in a variety of other power transmission systems including, but not limited to magnetic resonance imaging (MRI) systems and industrial heating systems such as inductive and dielectric heating systems. For example, in MRI systems, analysis of harmonic amplitude and phase information may be utilized to control and regulate magnetic resonance of transmitted signals under various load (e.g. patient) conditions. In industrial heating applications, analysis of harmonic amplitude and phase information may be utilized to control and regulate power flow to the work-piece and/or processing apparatus to improve processing performance.

SUMMARY OF THE INVENTION

A measuring probe for measuring power flow in an RF power transmission system, including a voltage sensor and a current sensor connected to a measuring receiver for receiving and measuring RF voltage and current signals. RF voltage and current signals are converted into digital representations of the RF waveforms, either directly, or by sampling-based frequency converters that bring the RF voltage and current signals to a fixed intermediate frequency (IF) before digital conversion. The digital representations of the RF signals contain fundamental and harmonic amplitude and phase information relating to the original RF signals. Digital signal processing circuitry manages data capture, mathematical transforms, signal filters, scaling, and creation of mathematically alterable analog outputs for external process control. Also, the circuitry extracts information about the fundamental and harmonic amplitude and phase components of each of the original RF signals. A universal serial bus (USB) and/or Ethernet connection is provided for connecting the measuring receiver to an external computer for additional numerical and graphical analysis.

Also disclosed is a method for measuring and analyzing power flow parameters in an RF transmission system wherein a plurality of measuring probes are inserted in the power transmission path to determine impedance match, insertion loss and power flow. The networked probes may provide two-port measurements, and may be used to determine input impedance, output impedance, insertion loss, internal dissipation, power flow efficiency, scattering, and the effect of plasma non-linearity on the RF signal. In one exemplary embodiment of the present invention, a single measuring receiver is employed to retrieve data from several probes, wherein the data from the several probes is fed to an external computer for post processing. In another exemplary embodiment, multiple measuring receivers are connected to each probe individually, thereby allowing for "real time" processing of system data.

The above and still further objects, features and advantages of the present invention will become apparent upon consideration of the following detailed description of exemplary embodiments thereof in conjunction with the accompanying drawings and appended claims.

DETAILED DESCRIPTION OF INVENTION

Figure 1:
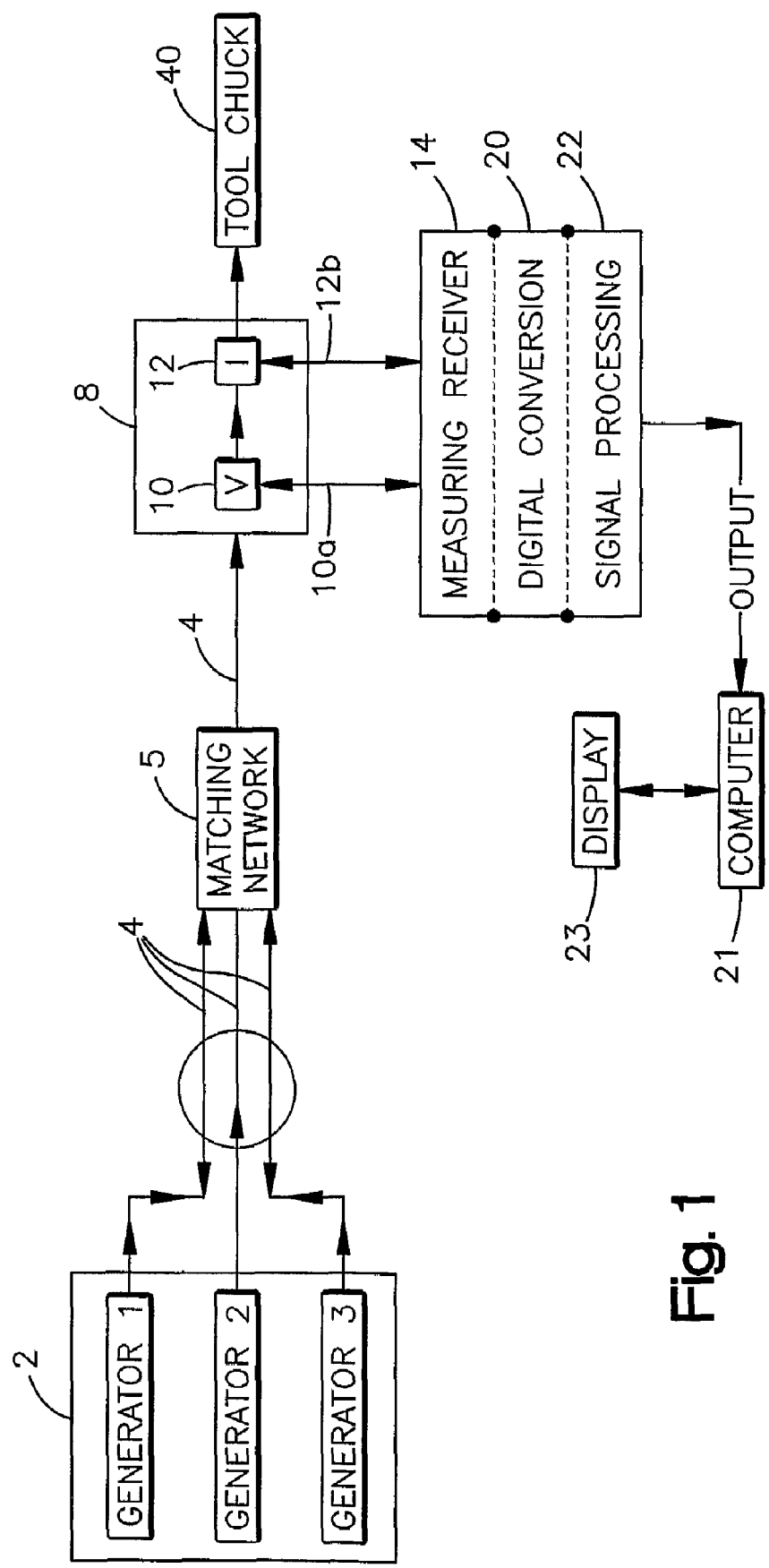
FIG. 1 is a general block diagram illustrating the operational concept of an embodiment of the invention.

With reference to the drawings which illustrate the basic concepts of the present invention, FIG. 1 is a general block diagram illustrating a system for measuring the fundamental and harmonic amplitude and phase relationships in an RF-based excitation system. One or more alternating power sources 2 generate alternating voltage and current signals which are transmitted via RF transmission lines 4 through a matching network 5 to a tool chuck 40, which may for example be a semiconductor plasma reactor. For purposes of the present disclosure, the term 'transmission line' is meant to encompass all known or later developed means for transmitting electrical signals including, but not limited to coaxial cable, waveguide, microstrip, twisted-pair, copper wire, and the like.

The matching network 5 converts the complex impedance of the plasma to match the characteristic load impedance for the generator at its fundamental frequency. A measuring probe 8 is inserted in the power transmission path to measure the voltage and current signals transmitted through the RF transmission lines 4. The measuring probe 8 is a high power device comprising a voltage sensor 10 and a current sensor 12 for sensing the voltage and current signals, respectively. The voltage sensor 10 and current sensor 12 are connected to the center conductor of the RF transmission line 4, whereby the sensor housing itself becomes part of the outer conductor of the transmission line.

The probe 8 is connected to a measuring receiver 14 comprising RF connector input channels 10a and 12b for receiving the voltage and current signals from the voltage and current sensors 10, 12, respectively. The receiver 14 also comprises a digital interface (not shown) for uploading temperature readings and calibration data stored in the probe housing, so that individual impedance probes can be calibrated with calibration data stored within the probe housing.

Figure 2:
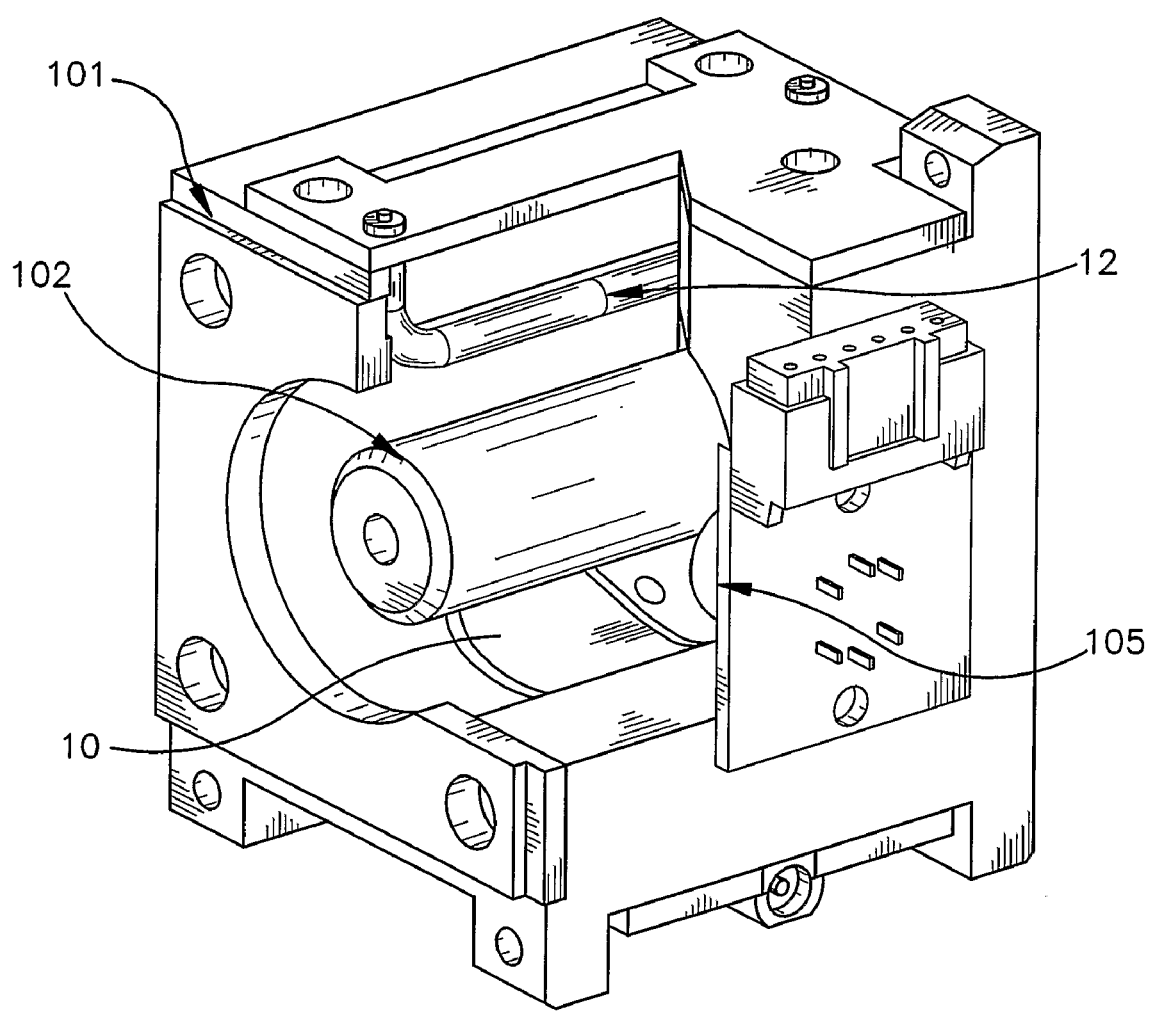
FIG. 2 is a schematic drawing of an exemplary probe assembly in accordance with an embodiment of the present invention.

Referring now to FIG. 2, the current sensor 12 of the measuring probe 8 comprises a single loop of rigid coaxial transmission line that is positioned parallel with the center conductor 102 of the probe 8 and associated transmission line 4. The outer conductor of the current sensor 12 is modified to act as a Faraday Shield, so that extraneous capacitive coupling is eliminated and only the mutually coupled RF current produces an output voltage. The voltage at one end of the current sensor loop 12 is connected to the measuring receiver interface in a manner known in the art to measure the current signals transmitted through the transmission line 4.

Referring again to FIG. 2, the voltage sensor 10 typically comprises a disk that is capacitively coupled to the center conductor 102 of the probe 8. The voltage sensor 10 is connected to the input of the transmission line, which in turn is connected to the measuring receiver interface to receive and measure the RF voltage signals from the transmission line 4.

In one exemplary embodiment of the invention, the cavity region between the probe housing 101 and the center conductor 102 may be filled with a dielectric material in order to raise the breakdown voltage so that the measuring probe 8 can withstand voltage levels in excess of 7500 volts peak. It is understood that the dimensions of the center conductor 102 and the housing 101 may be adjusted so that the characteristic impedance of the line section is approximately 50 ohms.

In order to maintain the precision of the measurement results provided by the probe sensors 10, 12, the temperature of the center conductor 102 and outer conductor/housing 101 are constantly monitored, and small adjustments to sensor calibration coefficients are made to correct for inevitable changes in sensor coupling caused by heating of the center conductor 102.

Each probe 8 is characterized by a calibration process that determines the exact current and voltage coupling coefficients and the phase angle between them over the operating frequency range of the device. During the calibration process, the temperature of the center conductor 102 and outer conductor/housing 101 are recorded. This calibration data or information is stored within the probe assembly in digital form and is retrieved each time the probe 8 is attached to a measuring receiver 14. As a result, multiple measuring probes 8 can share a single measuring receiver 14 because the locally stored temperature readings and calibration data is loaded each time the probes and receivers are mated. In addition to calibrating the individual probes, the interconnecting transmission lines are also individually calibrated. The calibration data from the transmission line is stored within the transmission line assembly itself. In our exemplary embodiment, the transmission line assembly consists of two RF cables and a data cable. A digital memory chip is located inside the data cable connector, allowing calibration data from the transmission line assembly to be stored within the transmission line assembly itself. The measuring receiver is adapted to download calibration data from the transmission line and the probe housing via a digital interface. In this way, the calibration process of the present invention allows each component to be calibrated individually. This individual calibration process advantageously allows interchangeability of individual components in the field without the requirement of performing a total system re-calibration.

In operation, the temperature of the center conductor 102 is constantly monitored using an infrared thermometer 105, and the reading is then compared to the temperature of the outer conductor/housing 101. The resulting temperature difference is used to make adjustments to the voltage and current coupling coefficients due to the change in size and spacing of the center conductor 102 with respect to the outer conductor/housing 101. Simultaneously, the parasitic reactances associated with the probe components may also be determined. The calibration process also adjusts the measured impedance information to account for the parasitic reactance of the probe.

Figure 3A:
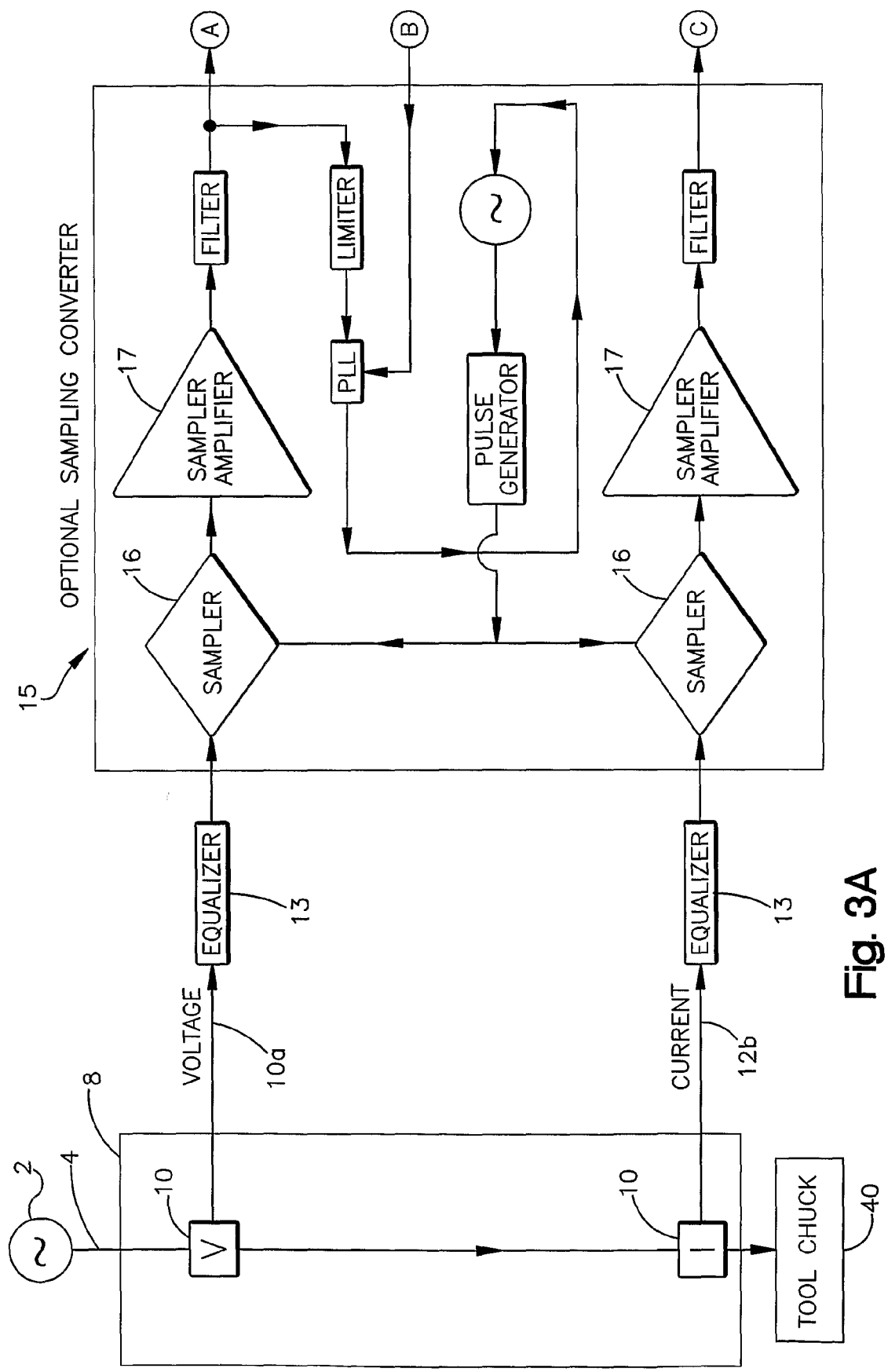
FIGS. 3A, 3B are schematic block diagrams illustrating a processing circuit for carrying out a process of the present invention.
Figure 3B:
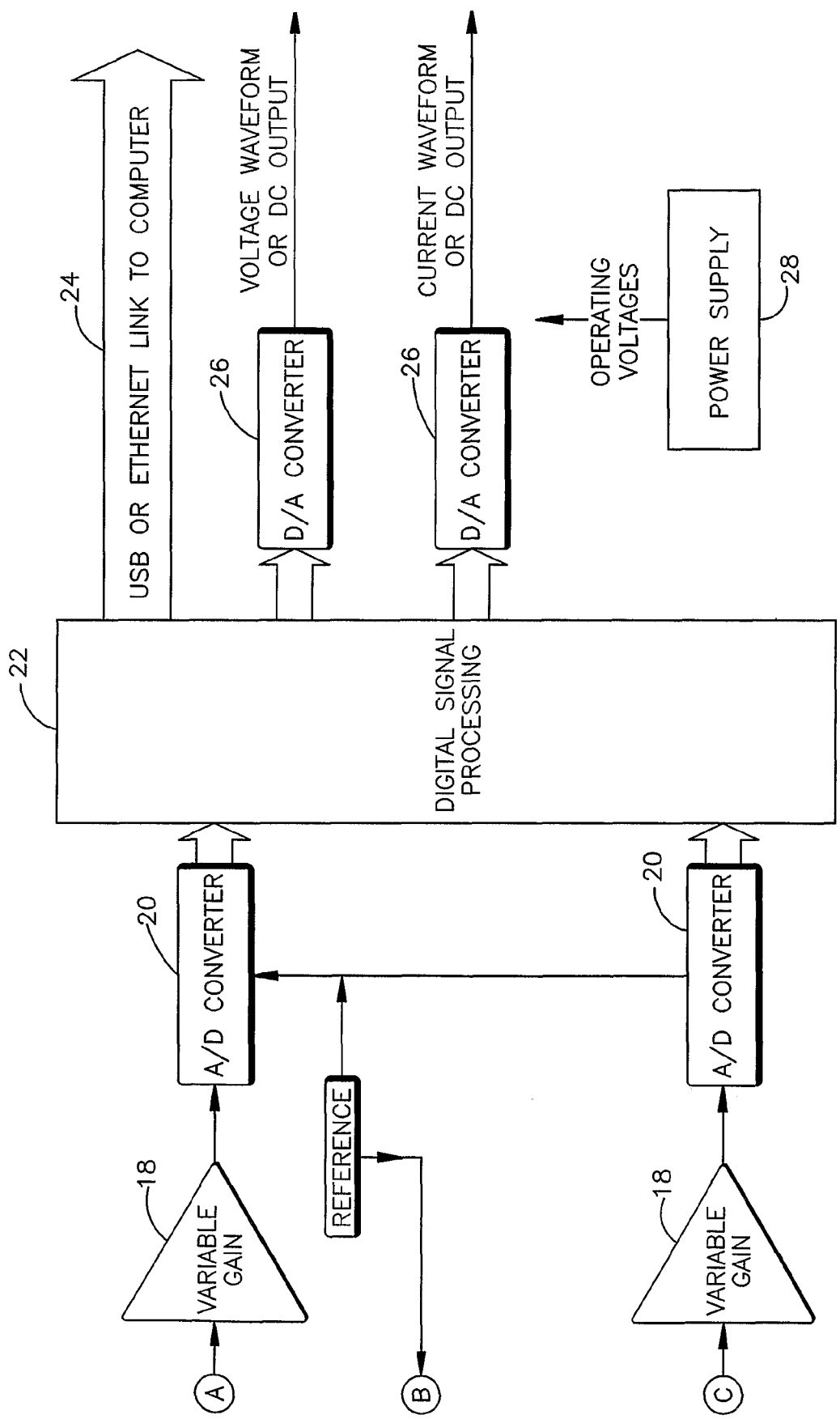

Turning now to FIGS. 3A, 3B, the voltage and current signals received from the voltage and current sensors 10, 12 are processed similarly. The voltage and current signals are isolated from each other by the respective voltage channel 10a and current channel 12b. Due to large fluctuations in signal levels associated with changes in the operating frequency, an active equalizer 13 is implemented between the voltage and current sensors 10, 12 in the form of a wide bandwidth operational amplifier with capacitive feedback. The equalizer 13 "integrates" the voltage and current signals to compensate for the "rate-of-change" response of the voltage and current sensors 10, 12. In one exemplary embodiment, the outputs of the equalizers are connected to a sampling-based frequency converter 15 to bring the signal under test to a fixed intermediate frequency (IF) before digital conversion. In another embodiment, the outputs of the equalizers 13 may be connected directly to variable gain stages 18 and A/D converters 20 for digital conversion.

As illustrated in FIG. 3A, an optional sampling-based frequency converter 15 may be used to convert the RF signals and harmonics thereof to much lower IF frequencies which are then compatible with bandwidth restrictions of existing high-resolution analog-to-digital (A/D) converter technology. In this embodiment, a pair of sampling gates 16 are part of a zero-order-hold circuit that captures a small sample of the RF signal and holds that value until the next sample is taken. The sampling gates are closed by a narrow pulse of about 300 picoseconds duration. During the instant that the sampling gate is closed, the RF signal voltage is impressed on a sampling capacitor. Sampler amplifiers 17 are employed to buffer the voltage on the sampling capacitor so that the level is maintained between samples. The bandwidth of the sampler is sufficiently wide so as not to significantly affect the phase of signals up to about 1000 MHz. Predictable delay related phase shift can be calibrated out in the digital signal processing circuits 22. Referring to FIGS. 3A, 3B, the IF signals are phase locked to the conversion cycle of the A/D converters 20 so that a plurality of samples can be taken for each cycle at the highest desired harmonic of the IF. In accordance with an exemplary embodiment of the invention, exactly four samples are taken for each cycle of the highest desired harmonic of the IF. In a preferred embodiment, the sampling rate is calculated so that the RF waveform reproduced at the IF frequency maintains the corresponding phase relationship between the fundamental signal frequency and harmonics of the fundamental signal frequency, and preserves up to about fifteen harmonics of the fundamental operating frequency.

One advantage of using a sampling-based frequency converter is that a local oscillator frequency shift from only about 1.95 to 2.1 MHz is needed to cover all of the typical plasma generator frequencies of 2, 13.56, 27.12, 60, and 162 MHz. Moreover, sampling-based frequency converters generally have the simplest architecture and highest bandwidth when compared to traditional mixer-based frequency converters.

However, because sampling down conversion translates all signals within the input RF bandwidth simultaneously, it may not be entirely appropriate for systems where multiple excitation signal frequencies are used. In the case of multiple excitation frequencies, Nyquist sampling may be advantageously used. It is also contemplated that the sampling means may comprise a combination of a Nyquist sampling rate analog-to-digital converter and a band-pass sampling analog-to-digital converter for sampling and digitizing the RF voltage and current signals. It is known that Nyquist sampling acquires at least two samples per cycle of the highest frequency of interest. Once the signals have been digitized, digital signal processing circuitry 22 does additional signal processing including data capture management, mathematical transforms, filters, scaling, and creation of mathematically alterable analog outputs for external control systems. A high speed universal serial bus (USB) or Ethernet port 24 serves to connect the probe assembly to an external computer 21 for additional numerical and graphical analysis. A pair of digital-to-analog converters 26 may be employed to receive output from the digital signal processor 22 in order to reconstruct the original RF voltage and current waveforms. Power supply circuits 28 generate the necessary internal operating voltages from an external DC supply.

Figure 4A:
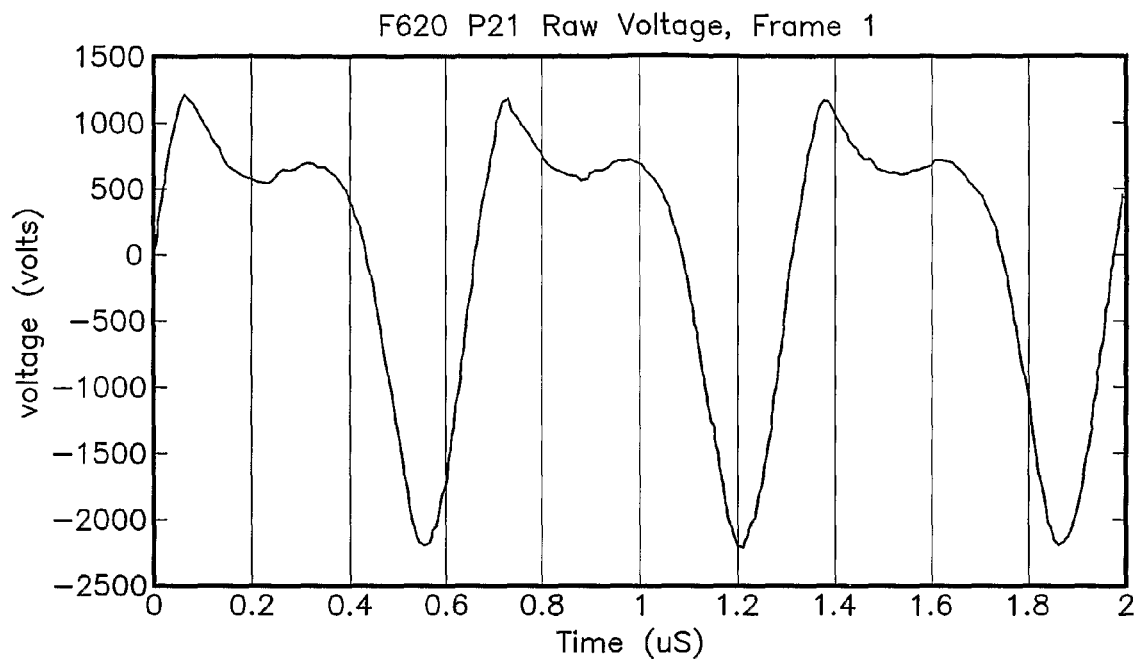
FIGS. 4A, 4B and 4C are graphs illustrating exemplary voltage, current, and power waveforms, respectively, generated in accordance with an embodiment of the present invention.
Figure 4B:
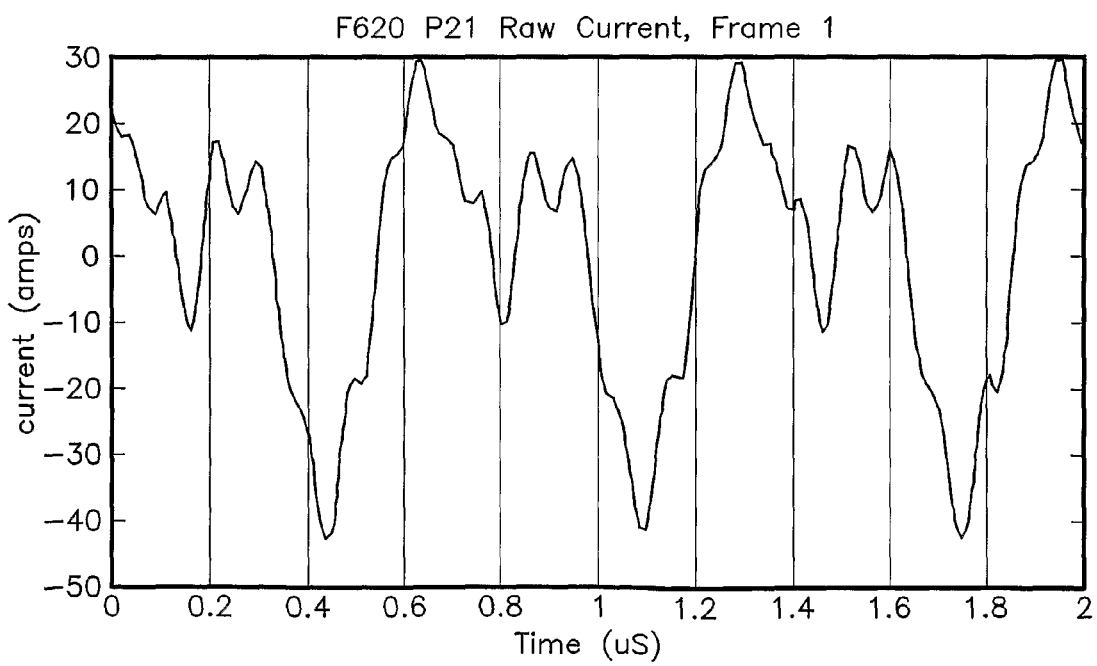
Figure 4C:
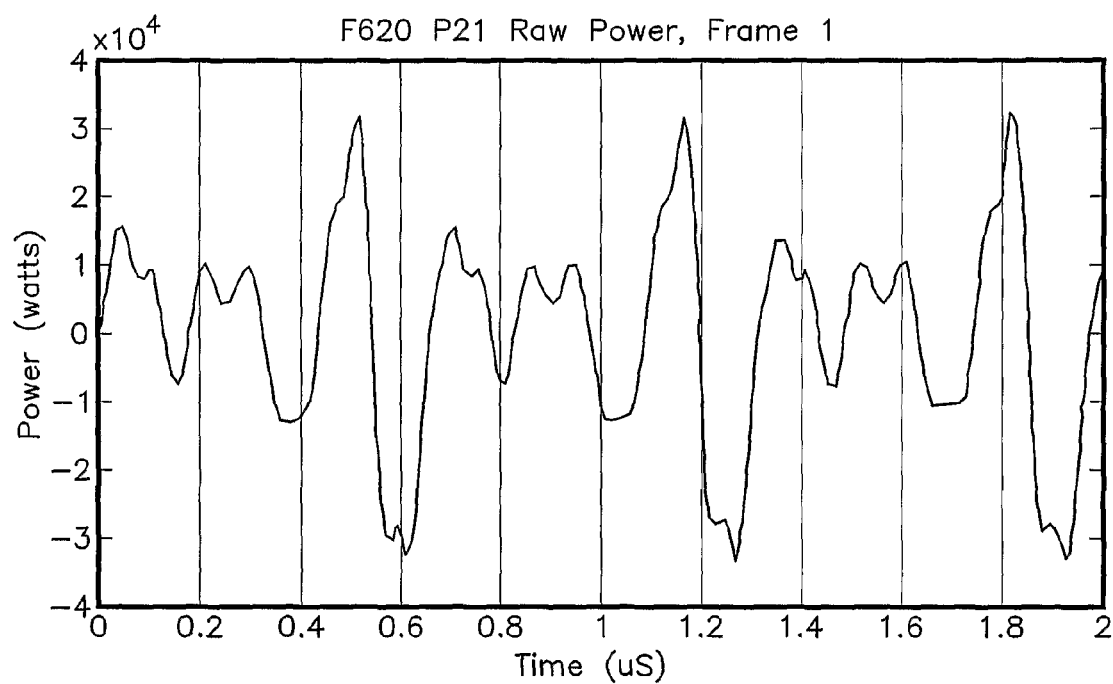

Referring now to FIGS. 4A, 4B, and 4C, there is shown exemplary waveform data generated in accordance with an embodiment of the present invention. FIG. 4A illustrates an exemplary raw voltage waveform, FIG. 4B illustrates an exemplary raw current waveform, and FIG. 4C illustrates an exemplary raw power waveform. In accordance with the present invention, Fourier transforms are used to separate the fundamental frequency and harmonic components of the voltage and current signals so that digital signal processing algorithms can be applied to correct the amplitude and phase of individual frequency components. This process removes imperfections in the coupling response of the probe sensors and removes parasitic reactance associated with probe construction. Individual frequency components may then be recombined in the proper phase relationships so as to recreate the original voltage and current waveforms. The output results of the digital signal processing section comprises voltage, current, phase angle, power and impedance at each frequency component, along with waveform data.

When multiple probes are used, the input and output impedances and insertion loss can also be determined easily. Once the two-port impedance parameters are determined, all other two-port parameters can be calculated. For example, the impedance parameters can be converted to admittance or scattering parameters.

Figure 5:
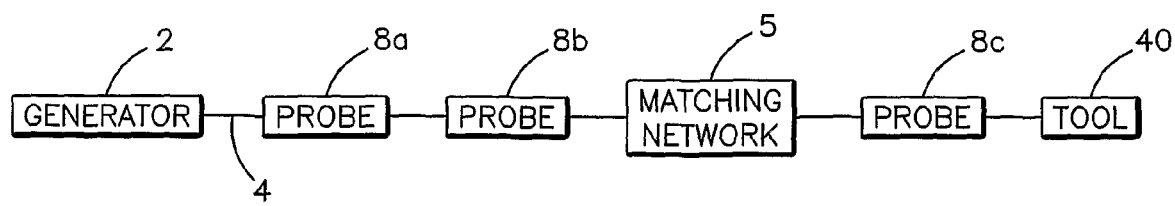
FIG. 5 is a general block diagram illustrating a multiple probe networking arrangement for carrying out a process of the present invention.

Turning now to FIG. 5, there is illustrated a method for analyzing power flow in an RF based excitation system, wherein two or more measuring probes 8a, 8b, 8c are inserted at different points in the RF power transmission line 4 so as to reveal information about power flow parameters in the RF excitation system. For example, measuring probe 8a may be inserted between the generator 2 and transmission line 4, whereas measuring probe 8b may be inserted between the transmission line and matching network 5, and probe 8c may be inserted between the matching network 5 and the tool chuck 40. The outputs from the networked probes can then be combined to reveal information about the impedance match and insertion loss of the components in the RF excitation system.

Measurements from the multiple probes are made simultaneously at the fundamental and harmonically related signal frequencies. The networked probes are then interrogated to recover instantaneous voltage, current, and phase information representing power flow and impedance levels at different points in the power application path. In this way, the characteristics of transmission lines 4, matching devices 5, connectors, and reactor plasma itself can then be quantified, for example, by calculating two-port impedance, admittance, transmission, and/or scattering parameters associated with pairs of probes. The calculations reveal the characteristics of each component at the fundamental excitation frequency and each of the harmonics simultaneously. For example, two-port measurements from the probes 8b, 8c positioned before and after the matching network, respectively, can be used to determine input or output impedance (admittance), insertion loss, internal dissipation, and power transmission efficiency at the fundamental or the harmonic frequencies of the RF signal. Measurements from probe 8c positioned between the matching network 5 and the tool chuck 40 can be used to reconstruct the RF voltage and current waveforms to observe the effect of plasma non-linearity on the RF signals.

The exemplary methods discussed above provide critical information about the fundamental and harmonic amplitude and phase relationships of the RF excitation signals. This information can then be monitored to determine faults and improper operation in any of the functional blocks during normal tool operation. The probes may be checked periodically in a maintenance mode, and the measurement data may be analyzed to identify opportunities for process improvement. In a preferred embodiment, the measuring probes are constructed to isolate the voltage and current signals and maintain sufficient RF bandwidth to preserve up to at least fifteen harmonics of the highest test (i.e. excitation) signal frequency, although it is contemplated that more or less harmonics of the test signal could be preserved without departing from the scope of the present invention.

As discussed above, a single measuring receiver may be employed to retrieve data from several probes, and the data from the several probes may be fed to an external computer for post processing. Multiple measuring receivers may be connected to each of the impedance probes individually, thereby allowing for "real time" processing of system data. The bulk of signal processing is done using an external computer, and results are presented and displayed by display 23 in a flexible user controlled format.

In the foregoing specification, the invention has been described with reference to specific exemplary embodiments thereof. It will, however, be evident that various modifications and changes may be made thereunto without departing from the broader spirit and scope of the invention as defined in the following claims.

What is claimed is:

1. A system for analyzing power flow in a radio frequency (RF) power transmission line, comprising:
    a measuring probe having a voltage sensor and a current sensor for sensing RF voltage and current signals from said transmission line, said RF voltage and current signals having waveforms;
    a measuring receiver connected to said voltage and current sensors for receiving said RF signals;
    a sampling means for directly converting said RF signals to digital signals, said digital signals comprising amplitude and phase information representing a fundamental frequency of said RF signals and a predetermined number of harmonics of said fundamental frequency; and
    a digital signal processing means for characterizing said amplitude and phase information so as to analyze power flow parameters and to reveal amplitude and phase angle relationships between said fundamental and harmonic frequencies;
    wherein said digital signal processing means reconstructs said RF voltage and current waveforms by recombining said harmonic frequencies in the proper phase relationships using said information about phase angle relationships between said fundamental and harmonic frequencies.

2. The system of claim 1, further comprising a digital-to-analog converter for reconstructing said RF signals.

3. The system of claim 1, wherein said probe and said transmission line comprise a digital storage means for storing calibration data from said probe and said transmission line, respectively.

4. The system of claim 3, wherein said measuring receiver comprises a digital interface for receiving said calibration data from said probe and said transmission line.

5. The system of claim 4, further comprising a computer connected to said digital signal processor for additional numerical and graphical processing of said digital signals.

6. The system of claim 5, further comprising an equalizer to compensate for fluctuations in said RF voltage and current signals.

7. The system of claim 1, wherein said sampling means comprises a band-pass sampling analog-to-digital converter for sampling said RF signals.

8. The system of claim 1, wherein said sampling means comprises a Nyquist sampling rate analog-to-digital converter for sampling said RF signals.

9. The system of claim 1, wherein said sampling means comprises a combination of a Nyquist sampling rate analog-to-digital converter and a band-pass sampling analog-to-digital converter for sampling said RF signals.

10. The system of claim 1, wherein said predetermined number of harmonics consists of up to about fifteen harmonics of said fundamental frequency.

11. The system of claim 1, wherein said power flow parameters comprise input impedance, insertion loss, internal dissipation, plasma non-linearity, power flow efficiency, scattering, and combinations thereof.

12. A method of analyzing power flow in an RF transmission line, comprising the steps of:
    connecting at least one measuring probe to said RF transmission line;
    receiving RF voltage and current signals from said RF transmission line via said at least one measuring probe, said RF voltage and current signals having waveforms;
    converting said RF signals to corresponding digital signals, said digital signals comprising amplitude and phase information representing a fundamental frequency of said RF signals and a predetermined number of harmonics of said fundamental frequency; and
    processing said digital signals so as to analyze power flow parameters and to reveal amplitude and phase angle relationships between said fundamental and harmonic frequencies;
    wherein said information about phase angle relationships between said fundamental and harmonic frequencies permits the recombining of said harmonic frequencies in the proper phase relationships so as to reconstruct said RF voltage and current waveforms.

13. The method of claim 12, further comprising the steps of:
    converting said digital signals to analog signals so as to reconstruct said RF signals; and
    transmitting said digital signals to an external computer for additional numerical and graphical processing.

14. The method of claim 13, further comprising the steps of storing calibration data from said at least one probe and said transmission line and downloading said calibration data to a measuring receiver.

15. The method of claim 14, further comprising the steps of interchanging said at least one probe and/or said transmission line, and downloading updated calibration data from said interchanged probe and/or transmission line to said measuring receiver.

16. The method of claim 15, further comprising the step of displaying results of said processing steps in a user controlled format.

17. The method of claim 16, further comprising the steps of:
    connecting an RF power source and a tool chuck to said RF transmission line;

connecting a matching network to said RF transmission line between said power source and said tool chuck;
connecting at least one of said probes between said power source and said matching network, and connecting another one of said probes between said matching network and said tool chuck.

18. The method of claim 17, wherein said power flow parameters comprise input impedance, insertion loss, internal dissipation, plasma non-linearity, power flow efficiency, scattering, and combinations thereof.

19. The method of claim 18, wherein said sampling frequency consists of at least two samples taken for each cycle at the highest said predetermined harmonic of said fundamental frequency.

20. The method of claim 12, wherein said predetermined number of harmonics consists of up to about fifteen harmonics of said fundamental frequency.

* * * * *